(12) United States Patent
Anda et al.

(10) Patent No.: US 6,967,360 B2
(45) Date of Patent: Nov. 22, 2005

(54) PSEUDOMORPHIC HIGH ELECTRON MOBILITY TRANSISTOR WITH SCHOTTKY ELECTRODE INCLUDING LANTHANUM AND BORON, AND MANUFACTURING METHOD THEREOF

(75) Inventors: Yoshiharu Anda, Okayama (JP); Akiyoshi Tamura, Suita (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 18 days.

(21) Appl. No.: 10/617,793

(22) Filed: Jul. 14, 2003

(65) Prior Publication Data

US 2004/0155261 A1 Aug. 12, 2004

(30) Foreign Application Priority Data

Feb. 7, 2003 (JP) ........................ 2003-031214

(51) Int. Cl.$^7$ ........................... H01L 31/0328
(52) U.S. Cl. ................. 257/190; 257/191; 257/192; 257/200; 257/280; 257/284; 257/E29.041
(58) Field of Search ............... 257/260–261, 257/279–284, E27.069, E29.041, E31.074, 190–192, 200

(56) References Cited

U.S. PATENT DOCUMENTS 5,550,065 A * 8/1996 Hashemi et al. ............ 438/182
5,693,969 A * 12/1997 Weitzel et al. ............. 257/280
2004/0119090 A1 * 6/2004 Chiu et al. .................. 257/194

FOREIGN PATENT DOCUMENTS

| JP | 61-91966 | 5/1986 | |
| JP | 63-169064 | 7/1988 | |
| JP | 63-299164 | 12/1988 | |
| JP | 06224441 A * | 8/1994 | ......... H01L/29/788 |
| JP | 9-45894 | 2/1997 | |

* cited by examiner

Primary Examiner—George Fourson
Assistant Examiner—Thanh V. Pham
(74) Attorney, Agent, or Firm—Wendertoh, Lind & Ponack, L. L. P.

(57) ABSTRACT

A semiconductor device and its manufacturing method. The semiconductor device has a semi-insulating GaAs substrate 310, a GaAs buffer layer 321 that is formed on the semi-insulating GaAs substrate 310, AlGaAs buffer layer 322, a channel layer 323, a spacer layer 324, a carrier supply layer 325, a spacer layer 326, a Schottky layer 327 composed of an undoped $In_{0.48}Ga_{0.52}P$ material, and an n$^+$-type GaAs cap layer 328. A gate electrode 330 is formed on the Schottky layer 327, and is composed of $LaB_6$ and has a Schottky contact with the Schottky layer 327, and ohmic electrodes 340 are formed on the n$^+$-type GaAs cap layer 328.

4 Claims, 6 Drawing Sheets

PSEUDOMORPHIC HIGH ELECTRON MOBILITY TRANSISTOR WITH SCHOTTKY ELECTRODE INCLUDING LANTHANUM AND BORON, AND MANUFACTURING METHOD THEREOF

BACKGROUND OF THE INVENTION (1) Field of the Invention

The present invention relates to a semiconductor device with a Schottky junction electrode made of a compound semiconductor and its manufacturing method.

(2) Description of the Related Art

In recent years, a Field Effect Transistor (hereinafter, referred to simply as FET), made of a compound semiconductor, for example, III–V family materials such as GaAs or InP, has been widely employed for wireless communication and especially as a power amplifier, a switch and the like of a cell phone terminal. Among FETs made of GaAs out of FETs made of a compound semiconductor, a Pseudomorphic High Electron Mobility Transistor (hereinafter, referred to simply as PHEMT) is generally utilized. Here, PHEMT is a FET with good high-frequency wave characteristics including a strain channel layer generated by bonding two types of semiconductors whose lattice constants are a little different. The FETs made of GaAs, for example, include the strain channel layer generated by bonding InGaAs and AlGaAs.

In the GaAs PHEMT like this, however, an AlGaAs layer that is composed of AlGaAs has a Schottky contact with a gate electrode; parts of both sides in the portion of the AlGaAs layer that do not touch the gate electrode are exposed by recess etching. As a result, a natural oxide film is formed on the surface of the AlGaAs layer, and its surface level density increases even if the AlGaAs layer is protected by a protective insulation film. Especially when the PHEMT is a power FET, the power FET does not work well because of frequency dispersion of current characteristic.

A prior art to solve the problem is "Manufacturing Method of Field Effect Transistor" (Japanese Laid-Open Patent application No. 09-045894 (pp. 3–4, FIG. 1)). The prior art resolves the problem by using an InGaP layer that is composed of InGaP that can better restrain the formation of the natural oxide film on the surface of a semiconductor layer than AlGaAs as the semiconductor layer that has the Schottky contact with the gate electrode.

FIG. 1 is a cross-sectional diagram of a conventional GaAs PHEMT.

In the GaAs PHEMT shown in FIG. 1, an epitaxial layer 120 is formed on a semi-insulating GaAs substrate 110 that is composed of semi-insulating GaAs. Here, the epitaxial layer 120 is made up of a GaAs buffer layer 121 that is composed of a 1-$\mu$m-thick undoped GaAs material and lessens a lattice mismatch between the epitaxial layer 120 and a semi-insulating GaAs substrate 110; an AlGaAs buffer layer 122 that is composed of an undoped AlGaAs material; a channel layer 123 that is composed of a 20-nm-thick undoped $In_{0.2}Ga_{0.8}As$ material and in which carriers run; a spacer layer 124 that is composed of a 5-nm-thick undoped InGaP material; a carrier supply layer 125 that is a planer-doped only one atom layer with Si, n-type impurity ions; a Schottky layer 126 that is composed of a 30-nm-thick undoped InGaP material; and an $n^+$-type GaAs cap layer 127 that is composed of a 100-nm-thick $n^+$-type GaAs.

Additionally, on the Schottky layer 126, a gate electrode 130 that has a Schottky contact with the Schottky layer 126 is formed; and at two parts on the $n^+$-type GaAs cap layer 127, two ohmic electrodes 140 are formed. Further, in the vicinity of the ohmic electrodes 140, two element separation regions 150 are formed; in the vicinity of the gate electrode 130, an insulation film 160 that is composed of SiN or SiO is formed.

As is described above, the conventional GaAs PHEMT can restrain an increase in the surface level density because in the conventional GaAs PHEMT, a semiconductor layer that is composed of InGaP including In and P as constituents is used as the Schottky layer 126. Therefore, the formation of a natural oxide film on the surface of the Schottky layer is restrained.

However, the conventional GaAs PHEMT has a problem explained below.

In the process of manufacturing the conventional GaAs PHEMT, since heat of about 300° C. is added to the Schottky layer and the gate electrode, diffusion at the Schottky interface between the gate electrode and the Schottky layer occurs. As a result, a problem arises in that the Schottky characteristic deteriorates. At this time, leak current of the Schottky junction between a Gate and a Source is larger than that of the conventional PHEMT having the Schottky layer that is composed of AlGaAs, and deterioration such as strain of a device is seen also in RF characteristics.

FIG. 2 is a diagram showing forward current-voltage characteristics between a Gate and a Source of the PHEMT that has a Schottky layer that is composed of InGaP and the gate electrode that is composed of Ti. In FIG. 2, the broken line shows the forward current voltage characteristic between the Gate and the Source of PHEMT before heat processing at 400° C,, while the solid line shows the forward current voltage characteristic between the Gate and Source of PHEMT after the heat processing at 400° C.

It is apparent from FIG. 2 that the leak current at a time of low bias increases due to the 400° C. heat processing and that the Schottky junction is greatly deteriorated.

SUMMARY OF THE INVENTION

In view of the foregoing, it is the object of the present invention to provide a semiconductor device and its manufacturing method. The semiconductor can restrain an increase in the surface level density and has superior thermal stability. To achieve the above-mentioned object, the semiconductor of the present invention is a semiconductor device comprising: a Schottky layer; and a Schottky electrode that is formed on the Schottky layer and has a Schottky contact with the Schottky layer. The Schottky layer is composed of a compound semiconductor including In and P, and the portion of the Schottky electrode that touches the Schottky layer is composed of material whose main constituents are La and B. Here, it is acceptable that the Schottky layer is composed of one of InGaP, InP and InAlGaP, and that the portion of the Schottky electrode that touches the Schottky layer is composed of $LaB_6$. Additionally, it is agreeable that the semiconductor device is a transistor or a diode.

As noted above, the semiconductor device is made up of the Schottky layer that is composed of a compound semiconductor including In and P, and a Schottky electrode that is formed on the Schottky layer, and a portion of the Schottky electrode that touches the Schottky layer is composed of a material whose main constituents are La and B. Therefore, the semiconductor device can restrain an increase in the surface level density of the Schottky layer, and has superior thermal stability and good Schottky characteristics.

Additionally, the present invention provides a method of manufacturing a semiconductor device that has (i) an epitaxial layer that comprises a semiconductor layer and a Schottky layer and (ii) a Schottky electrode that is formed on the Schottky layer and has a Schottky contact with the Schottky layer. The manufacturing method includes an epitaxial process of forming an epitaxial layer by forming in sequence a semiconductor layer and a Schottky layer that is composed of a compound semiconductor including In and P on a semi-insulating substrate by epitaxial growth using one of Metal Organic Chemical Vapor Deposition method and Molecular-Beam Epitaxial method; and an electrode forming process of forming a Schottky electrode by evaporating material whose main constituents are La and B onto the Schottky layer. In this process, the portion of the Schottky electrode that touches the Schottky layer is composed of the evaporated material. Here, it is possible that the Schottky layer is composed of one of InGaP, InP and InAlGaP, and that the Schottky layer is formed in the epitaxial process, the Schottky layer being composed of one of InGaP, InP and InAlGap. Moreover, it is acceptable that the portion of the Schottky electrode that touches the Schottky layer is composed of $LaB_6$, and $LaB_6$ is evaporated onto the Schottky layer in the electrode forming process. Furthermore, it is agreeable that the vapor deposition of the material is performed with an electron-beam vapor deposition method.

Hereby, the Schottky electrode can be formed by vapor deposition, and it has the effect of allowing manufacture of the semiconductor device with simple process.

As further information about technical background to this application, Japanese patent application No. 2003-031214 filed on Feb. 7, 2003 is incorporated herein by reference.

BRIEF DESCRIPTION OF THE DRAWINGS

These and other subjects, advantages and features of the invention will become apparent from the following description thereof taken in conjunction with the accompanying drawings that illustrate a specific embodiment of the invention.

DESCRIPTION OF THE PREFERRED EMBODIMENT

The semiconductor device according to the present embodiments of the present invention will be explained below with reference to the figures.

(The First Embodiment)

Figure 1:
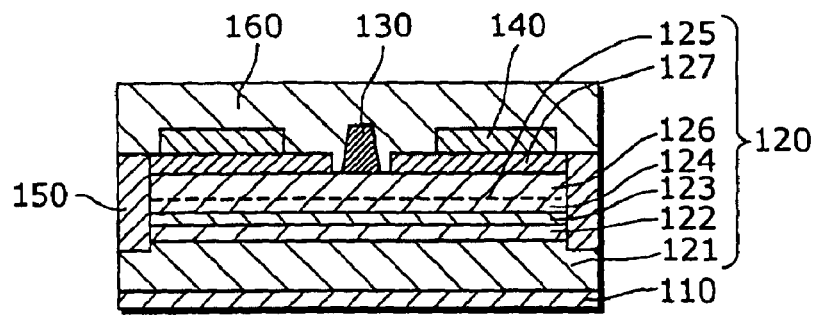
FIG. 1 is a cross-sectional diagram showing the structure of a conventional PHEMT.
Figure 2:
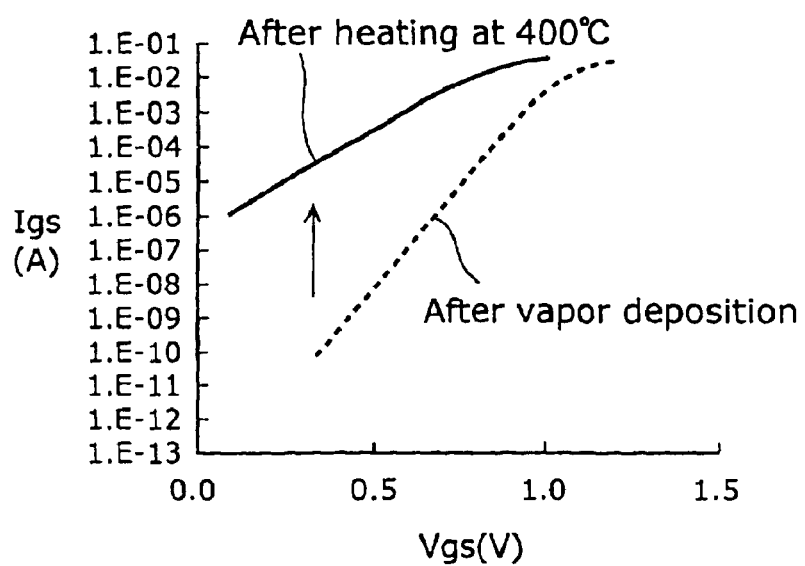
FIG. 2 is a diagram showing forward current-voltage characteristics between a Gate and a Source of the conventional PHEMT.
Figure 3:
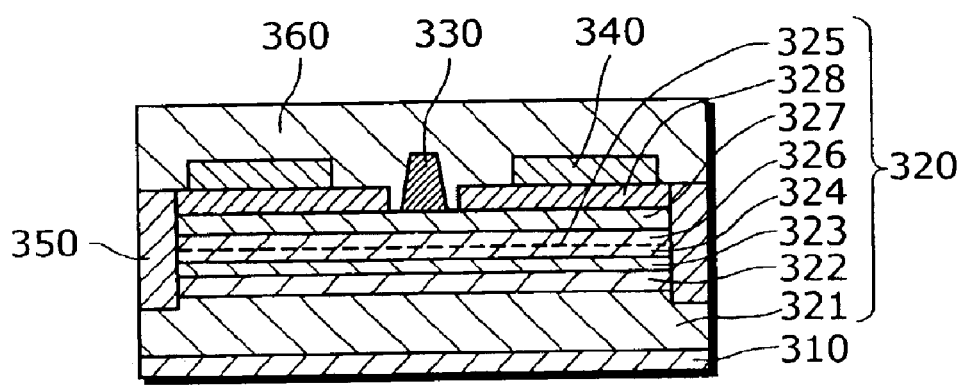
FIG. 3 is a cross-sectional diagram showing the structure of a GaAs PHEMT according to the first embodiment of the present invention.

FIG. 3 is a cross-sectional diagram showing the structure of a GaAs PHEMT according to the first embodiment.

In the PHEMT according to the first embodiment, an epitaxial layer 320 is formed on a semi-insulating GaAs substrate 310 that is composed of the semi-insulating GaAs material. Here, the epitaxial layer 320 is made up of a GaAs buffer layer 321 that is composed of a 1-$\mu$m-thick undoped GaAs material and lessens a lattice mismatch between the epitaxial layer 320 and the semi-insulating GaAs substrate 310; an AlGaAs buffer layer 322 that is composed of a 100-nm-thick undoped AlGaAs material; a channel layer 323 that is composed of a 20-nm-thick undoped $In_{0.2}Ga_{0.8}As$ material and in which carriers run; a spacer layer 324 that is composed of a 5-nm-thick undoped $Al_{0.25}Ga_{0.75}As$ material; a carrier supply layer 325 that is planer-doped only one atom layer with Si, n-type impurity ions so that the dose of Si is $5\times10^{12}$ cm$^{-2}$; a spacer layer 326 that is composed of a 20-nm-thick undoped $Al_{0.25}Ga_{0.75}As$ material; a Schottky layer 327 that is composed of a 10-nm-thick undoped $In_{0.48}Ga_{0.52}P$ material; and an n$^+$-type GaAs cap layer 328 that is composed of a 100-nm-thick n$^+$-type GaAs material. By the way, the Schottky layer 327 is described as being composed of $In_{0.48}Ga_{0.52}P$ material, but it may be composed of a compound semiconductor including In and P, for example, InGaP or InAlGaP.

Moreover, on the Schottky layer 327, a gate electrode 330 that has a Schottky contact with the Schottky layer 327 is formed. At two parts on the n$^+$-type GaAs cap layer 328, two ohmic electrodes 340 are formed. Further, in the vicinity of the ohmic electrodes 340, two element separation regions 350 are formed. In the vicinity of the gate electrode 330, an insulation film 360 that is composed of SiN or SiO is formed. Here, the gate electrode 330 is composed of material whose main constituents are La and B, for example, $LaB_6$.

Figure 4A:
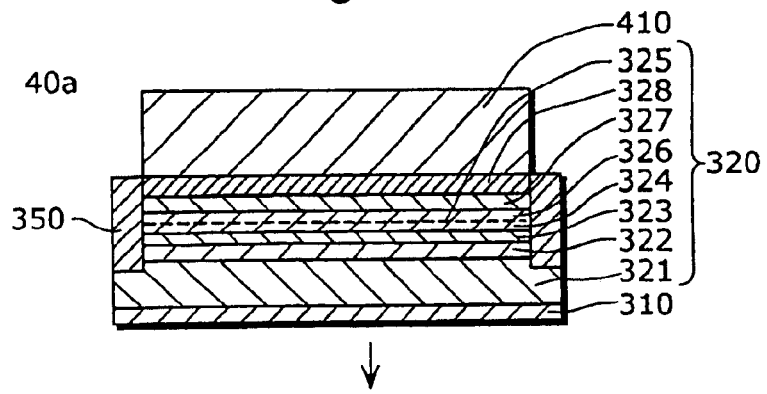
FIG. 4A~FIG. 4D are cross-sectional diagrams showing the structures of the GaAs PHEMTs indicating a manufacturing method for the GaAs PHEMT according to the first embodiment of the present invention.
Figure 4B:
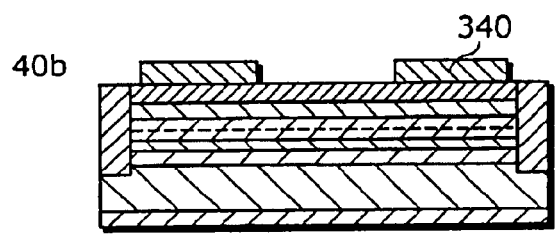
Figure 4C:
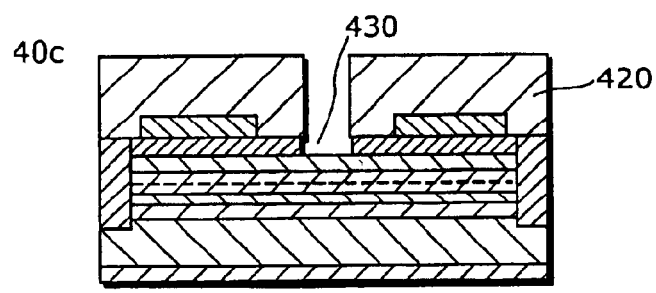
Figure 4D:
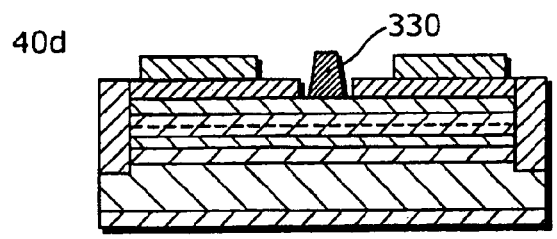
Figure 5:
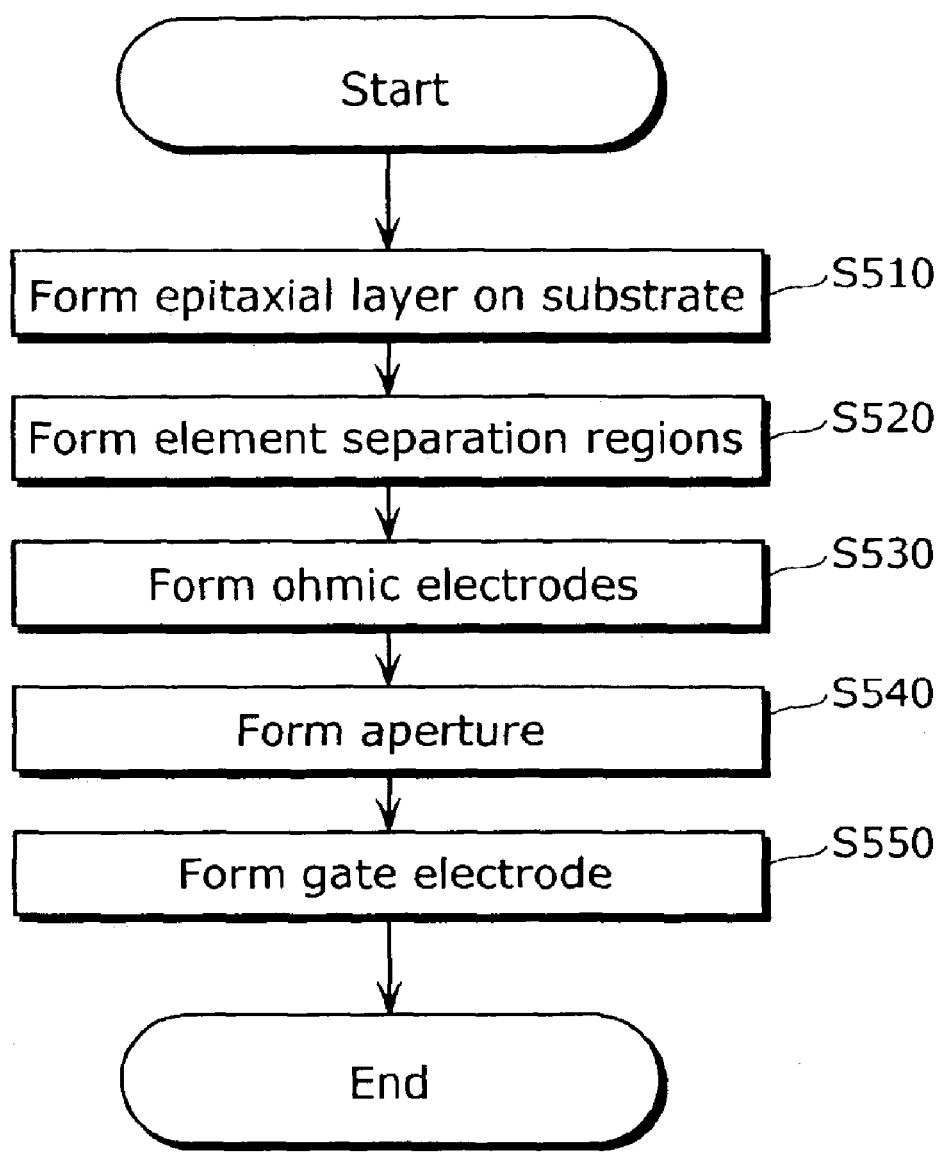
FIG. 5 is a flowchart showing the method of manufacturing the GaAs PHEMT according to the first embodiment of the present invention.

Next, a manufacturing method of the GaAs PHEMT with the structure described above is explained following the cross-sectional diagram shown in FIG. 4 and the flowchart shown in FIG. 5. It should be noted that the same elements in FIG. 3 are given the same characters and their detailed explanations are omitted here.

For a start, as shown in FIG. 4A, on the semi-insulative GaAs substrate 310, using an MOCVD (metal organic chemical vapor deposition) method or MBE (molecular-beam epitaxial) method, epitaxial growth is performed in sequence to form the GaAs buffer layer 321, the AlGaAs buffer layer 322, the channel layer 323, the spacer layer 324, the carrier supply layer 325, the spacer layer 326, the Schottky layer 327 and the n$^+$-type GaAs cap layer 328 to form the epitaxial layer 320 (Step S510). Then, the element separation regions 350 are formed by shaping a pattern to form the element separation regions 350 with a photo resist 410 and doping the ions into the region where the element separation regions 350 are formed (Step S520). By the way, the element separation regions 350 may be formed by performing mesa etching to the regions where the element separation regions 350 in the epitaxial layer 320 are formed.

Next, as shown in FIG. 4B, an aperture is formed in the region where the ohmic electrodes 340 are formed by shaping a pattern to form the ohmic electrodes 340 with the photo resist and performing etching, and the ohmic electrodes 340 are formed by evaporating an ohmic metal that is made of a Ni/Au/Ge alloy and lifting-off the photo resist (Step S530).

Now, as shown in FIG. 4C, an aperture is formed in the region where the gate electrode 330 is formed by shaping a pattern to form the gate electrode 330 with the photo resist 420 and performing etching. By performing recess etching, the aperture is formed in the region where the gate electrode 330 between the ohmic electrodes 340 on the n⁺-type GaAs cap layer 328 is formed, and an aperture 430 is acquired (Step S540). At this time, since the etching selectivity between the n⁺-type GaAs cap layer 328 and the Schottky layer 327 is large, a part of the n⁺-type GaAs cap layer 328 can be selectively removed by the recess etching to form the aperture 430, using a liquid mixture of phosphoric acid, hydrogen peroxide solution and water, and therefore, it is possible to perform stable recess etching.

Next, as shown in FIG. 4D, the gate electrode 330 is formed by evaporating the gate metal that is composed of material whose main constituents are La and B, for example, $LaB_6$, using an electron-beam vapor deposition method and the like and lifting off the photo resist (Step S550).

Now, evaluation results of the GaAs PHEMT according to the first embodiment are shown.

Figure 6:
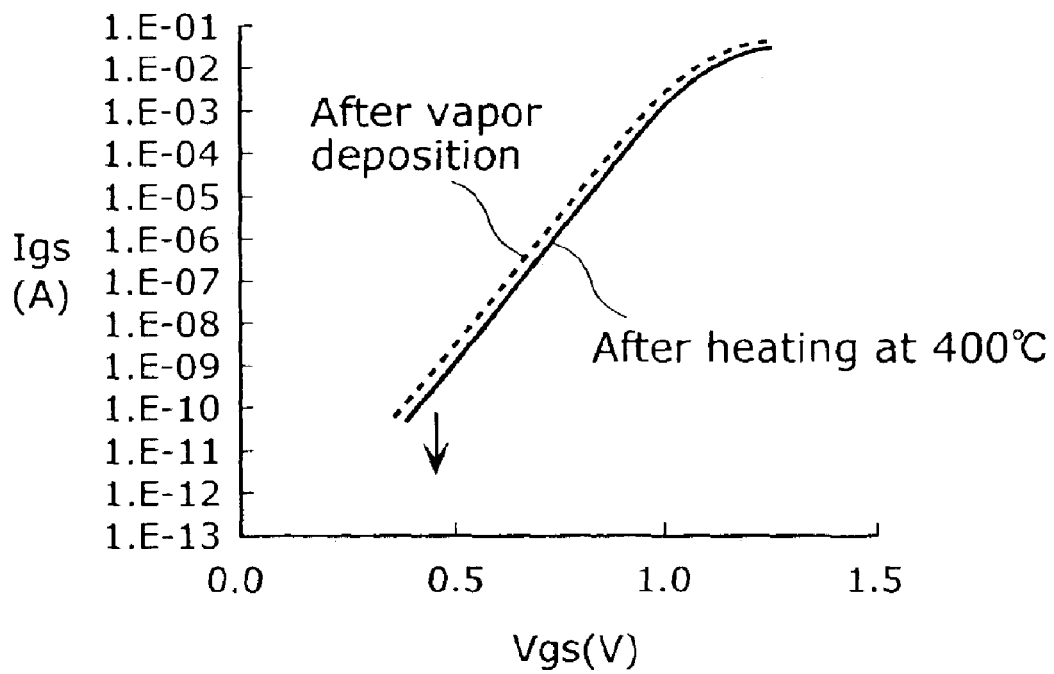
FIG. 6 is a diagram showing forward current-voltage characteristics between a Gate and a Source of the GaAs PHEMT according to the first embodiment of the present invention.
Figure 7:
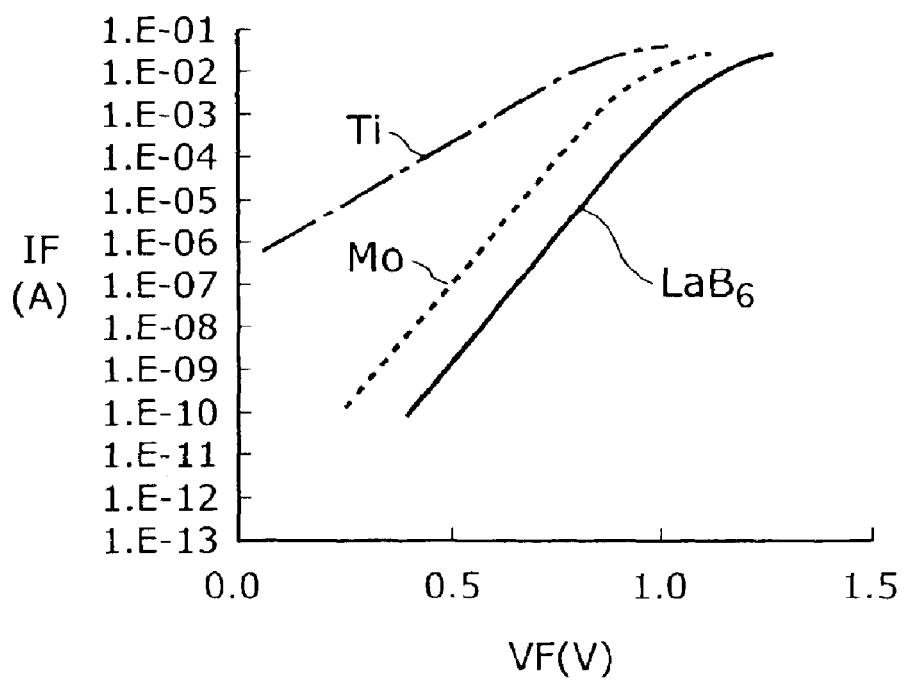
FIG. 7 is a diagram showing forward current-voltage characteristics between the Gate and the Source of the GaAs PHEMT according to the first embodiment of the present invention and the conventional PHEMT.

FIG. 6 and FIG. 7 are diagrams showing the forward current voltage characteristic between the Gate and the Source of the GaAs PHEMT according to the first embodiment. In FIG. 6, the dotted line shows the forward current voltage characteristic between the Gate and the Source of the PHEMT having the gate electrode that is composed of $LaB_6$ before heat processing at 400° C.; the solid line shows the forward current voltage characteristic between the Gate and the Source of the PHEMT having the gate electrode that is composed of $LaB_6$ after heat processing at 400° C. Additionally, in FIG. 7, the solid line shows the forward current-the voltage characteristic between the Gate and the Source of the PHEMT having the gate electrode that is composed of $LaB_6$ after heat processing at 400° C; the broken line shows the forward current voltage characteristic between the Gate and the Source of the PHEMT having the gate electrode that is composed of Ti after heat processing at 400° C.; and the dotted line shows the forward current voltage characteristic between the Gate and the Source of the PHEMT having the gate electrode that is composed of Mo after heat processing at 400° C.

In view of FIG. 6, it is apparent that the PHEMT having the gate electrode that is composed of $LaB_6$ according to the first embodiment is different from the conventional PHEMT having the gate electrode that is composed of Ti because its leak current does not increase after the heat processing at 400° C., and therefore, it has a thermally stable Schottky characteristic.

Moreover, seeing FIG. 7, it is apparent that the PHEMT having a gate electrode that is composed of $LaB_6$ has a higher Schottky barrier than the conventional PHEMT having a gate electrode that is composed of Ti, and the PHEMT having a gate electrode that is composed of $LaB_6$ has a higher Schottky barrier than the PHEMT having a gate electrode that is composed of Mo (another high-melting point metal) by about 0.1V. Therefore, the PHEMT has good Schottky characteristics.

As is described above, according to the first embodiment, the Schottky layer 327 is composed of $In_{0.48}Ga_{0.52}P$ material and the gate electrode 330 is composed of $LaB_6$ material, a high-melting point metal (melting point: 2806° C.). Consequently, interdiffusion by heat processing between the Schottky layer 327 and the gate electrode 330 can be restrained, and it is possible to obtain a PHEMT with superior thermal stability.

Furthermore, according to the first embodiment, the Schottky layer 327 is composed of $In_{0.48}Ga_{0.52}P$ material. Therefore, the PHEMT according to the first embodiment can restrain an increase of the surface level density of the Schottky layer.

Additionally, according to the first embodiment, the Schottky layer 327 is composed of $In_{0.48}Ga_{0.52}P$ material and the gate electrode 330 is composed of $LaB_6$. Consequently, the PHEMT according to the first embodiment can realize the PHEMT with good Schottky characteristics.

Moreover, according to the first embodiment, the gate electrode 330 is formed by vapor deposition. Therefore, the PHEMT can be manufactured with a simple process.

By the way, according to the first embodiment, the PHEMT is exemplified as a semiconductor device having (1) the gate electrode 330 that has a Schottky contact with the Schottky layer 327 and (2) the Schottky layer 327. But it is acceptable that the semiconductor device is another semiconductor device having (1) the gate electrode 330 that has a Schottky contact with the Schottky layer 327 and (2) the Schottky layer 327, for example, a Schottky diode.

Furthermore, according to the first embodiment, the gate electrode 330 is described to be composed of the material whose main constituents are La and B, but it is acceptable that the gate electrode is a lamination layer in which a layer that is composed of another material is formed on the layer that is composed of the material whose main constituents are La and B. At this time, in the process of forming the gate electrode 330, the lamination layer is formed by evaporating the gate metal that is composed of another material onto the gate electrode 330 after evaporating the gate metal that is composed of the material whose main constituents are La and B onto the gate electrode 330.

(The Second Embodiment)

Figure 8:
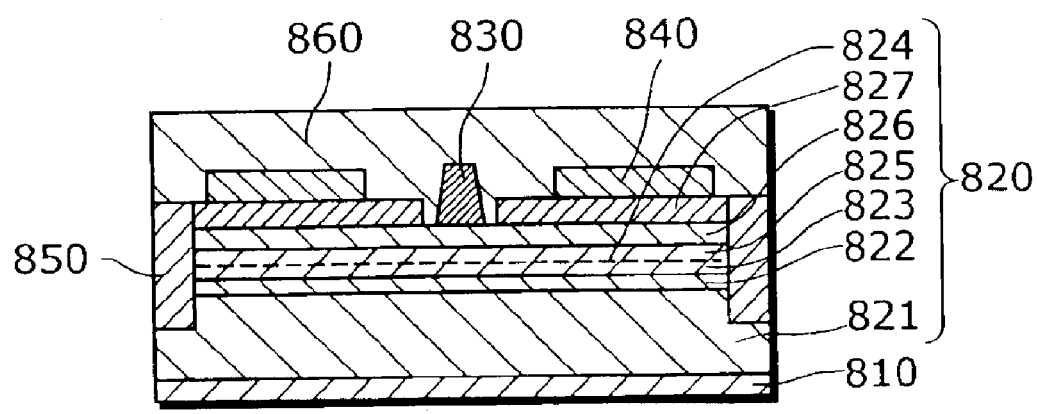
FIG. 8 is a cross-sectional diagram showing the structure of an InP PHEMT according to the second embodiment of the present invention.

FIG. 8 is a cross-sectional diagram showing the structure of an InP PHEMT according to the second embodiment of the present invention.

In the PHEMT according to the second embodiment, an epitaxial layer 820 is formed on a semi-insulating InP substrate 810 that is composed of the semi-insulating InP. Here, the epitaxial layer 820 is made up of an InAlAs buffer layer 821 that is composed of a 1-μm-thick undoped InAlAs material and lessens a lattice mismatch between the epitaxial layer 820 and the semi-insulating InP substrate 810; a channel layer 822 that is composed of a 20-nm-thick undoped $In_{0.53}Ga_{0.47}As$ material and in which carriers run; a spacer layer 823 that is composed of a 5-nm-thick undoped InAlGaAs material; a carrier supply layer 824 that is planer-doped only one atom layer with Si, n-type impurity ions so that the dose is $5 \times 10^{12}$ cm⁻²; an InAlAs layer 825 that is composed of a 20-nm-thick undoped InAlAs material; a Schottky layer 826 that is composed of a 10-nm-thick undoped InP material; and an n⁺-type InGaAs cap layer 827 that is composed of a 100-nm-thick n⁺-type InGaAs material. By the way, the Schottky layer 826 is described to be composed of InP but it may be composed of a compound semiconductor including In and P, for example, InAlGaP.

Additionally, on the Schottky layer 826, a gate electrode 830 that has a Schottky contact with the Schottky layer 826 is formed; and at two parts on the n⁺-type InGaAs cap layer 827, two ohmic electrodes 840 are formed. Further, in the vicinity of the ohmic electrodes 840, two element separation regions 850 are formed. In the vicinity of the gate electrode 830, an insulation film 860 composed of SiN or SiO is formed. Here, the gate electrode 830 is composed of material whose main constituents are La and B, for example, $LaB_6$.

Next, a manufacturing method of the InP PHEMT with the structure described above is explained. It should be noted that the figures are omitted because the InP PHEMT according to the second embodiment is manufactured by a method similar to the manufacturing method of the GaAs PHEMT according to the first embodiment.

For a start, on the semi-insulative InP substrate 810, using an MOCVD method or an MBE method, epitaxial growth is performed in sequence to form the InAlAs buffer 821, the channel layer 822, the spacer layer 823, the carrier supply layer 824, the InAlAs layer 825, the Schottky layer 826, the n$^+$-type InGaAs cap layer 827 which form the epitaxial layer 820. Then, the element separation regions 850 are formed by shaping a pattern to form the element separation regions 850 with a photo resist and doping the ions into the region where the element separation regions 850 are formed.

Next, an aperture is formed in the region where the ohmic electrodes 840 are formed by shaping a pattern to form the ohmic electrodes 840 with the photo resist and performing etching. The ohmic electrodes 840 are formed by evaporating an ohmic metal that is made of a Ni/Pt/Au alloy and lifting-off the photo resist.

Now, an aperture is formed in the region where the gate electrode 830 is formed by shaping a pattern to form the gate electrode 830 with the photo resist and performing etching. By performing recess etching, the aperture is formed in the region where the gate electrode 830 between the ohmic electrodes 840 on the n$^+$-type InGaAs cap layer 827 is formed, and an aperture is acquired. At this time, since the etching selectivity between the n$^+$-type InGaAs cap layer 827 and the Schottky layer 826 is large, a part of the n$^+$-type InGaAs cap layer 827 can be selectively removed by the recess etching to form the aperture, using a liquid mixture of phosphoric acid, hydrogen peroxide solution and water. Therefore, it is possible to perform stable recess etching.

Next, the gate electrode 830 is formed by evaporating the gate metal that is composed of material whose main constituents are La and B, for example, LaB$_6$, using the electron-beam vapor deposition method or the like and lifting off the photo resist.

As is described above, according to the second embodiment, the Schottky layer 826 is composed of InP and the gate electrode 830 is composed of LaB$_6$, a high-melting point metal. Consequently, interdiffusion by heat processing between the Schottky layer 826 and the gate electrode 830 can be restrained, and it is possible to realize the PHEMT with superior thermal stability.

Additionally, according to the second embodiment, the Schottky layer 826 is composed of InP and the gate electrode 830 is composed of LaB$_6$. Therefore, the PHEMT according to the second embodiment can realize the PHEMT with good Schottky characteristics.

Moreover, according to the second embodiment, the Schottky layer 826 is composed of InP. Consequently, the PHEMT according to the second embodiment can realize the PHEMT that can restrain an increase of the surface level density of the Schottky layer.

Furthermore, according to the second embodiment, the gate electrode 830 is formed by vapor deposition. Therefore, the PHEMT can be manufactured with a simple process.

By the way, according to the second embodiment, the PHEMT is exemplified as the semiconductor device having (1) the gate electrode 830 that has a Schottky contact with the Schottky layer 826, and (2) the Schottky layer 826. But it is acceptable that the semiconductor device is another semiconductor device having (1) the gate electrode 830 that has a Schottky contact with the Schottky layer 826, and (2) the Schottky layer 826, for example, a Schottky diode.

Additionally, according to the second embodiment, the gate electrode 830 is described to be composed of a material whose main constituents are La and B, but it is acceptable that the gate electrode is a lamination layer in which a layer that is composed of another material is formed on the layer that is composed of the material whose main constituents are La and B. At this time, in the process of forming the gate electrode 830, the lamination layer is formed by evaporating the gate metal that is composed of another material onto the gate electrode 830 after evaporating the gate metal that is composed of the material whose main constituents are La and B onto the gate electrode 830.

As is apparent from the above explanation, since the semiconductor device according to the present invention is made up of the Schottky layer that is composed of the compound semiconductor including In and P, and the Schottky electrode having a Schottky contact with the Schottky layer composed of the material whose main constituents are La and B, it has the effect of realizing a semiconductor device that is thermally stable and has good Schottky characteristics. Moreover, because the semiconductor device according to the present invention has the Schottky layer that is composed of the compound semiconductor including In and P, it has the effect of realizing a semiconductor device that can restrain an increase of the surface level density of the Schottky layer. Furthermore, since the Schottky electrode in the semiconductor device according to the present invention is formed by vapor deposition, it enables manufacture the PHEMT with simple process.

Consequently, since the present invention can restrain the increase of the surface level density in the Schottky layer and can provide a semiconductor device with superior thermal stability and good Schottky characteristics, its practical value is extremely high.

What is claimed is:

1. A pseudomorphic high electron mobility transistor comprising:
   a semi-insulating GaAs substrate;
   an epitaxial layer including a plurality of layers sequentially stacked on said GaAs substrate, said sequentially-stacked layers including:
   a GaAs buffer layer;
   an AlGaAs buffer layer;
   an undoped InGaAs channel layer;
   a first undoped AlGaAs spacer layer;
   a carrier supply layer;
   a second undoped AlGaAs spacer layer;
   an undoped InGaP Schottky layer; and
   a doped GaAs cap layer;
   a source electrode and a drain electrode formed on and in ohmic contact with said doped GaAs cap layer; and
   a gate electrode formed on said undoped InGaP Schottky layer so that said gate electrode extends through said doped GaAs cap layer, said gate electrode being composed of material whose main constituents are La and B.

2. The pseudomorphic high electron mobility transistor of claim 1, wherein said gate electrode is composed of LaB$_6$.

3. A pseudomorphic high electron mobility transistor comprising:
   a semi-insulating InP substrate;
   an epitaxial layer including a plurality of layers sequentially stacked on said InP substrate, said sequentially-stacked layers including:

an InAlAs buffer layer;
an undoped InGaAs channel layer;
an undoped InAlGaAs spacer layer;
a carrier supply layer;
an undoped InAlAs layer;
an undoped InP Schottky layer; and
a doped InGaAs cap layer;
a source electrode and a drain electrode formed on and in ohmic contact with said doped InGaAs cap layer; and
a gate electrode formed on said undoped InP Schottky layer so that said gate electrode extends through said doped InGaAs cap layer, said gate electrode being composed of material whose main constituents are La and B.

4. The pseudomorphic high electron mobility transistor of claim 3, wherein said gate electrode is composed of $LaB_6$.

* * * * *